(12) United States Patent
Kim et al.

(10) Patent No.: US 10,352,480 B2
(45) Date of Patent: Jul. 16, 2019

(54) BIDIRECTIONAL GATE VALVE

(71) Applicant: PRESYS.CO., LTD, Suwon-si (KR)

(72) Inventors: Bae-Jin Kim, Suwon-si (KR); Ki Sun Choi, Suwon-si (KR); Kang Hyun Kim, Suwon-si (KR); Sang Min Kim, Suwon-si (KR)

(73) Assignee: PRESYS.CO., LTD, Suwon (KR)

( * ) Notice: Subject to any disclaimer, the term of this patent is extended or adjusted under 35 U.S.C. 154(b) by 0 days.

(21) Appl. No.: 15/748,726

(22) PCT Filed: Jul. 11, 2016

(86) PCT No.: PCT/KR2016/007484
§ 371 (c)(1),
(2) Date: Jan. 30, 2018

(87) PCT Pub. No.: WO2017/022968
PCT Pub. Date: Feb. 9, 2017

(65) Prior Publication Data
US 2019/0011061 A1   Jan. 10, 2019

(30) Foreign Application Priority Data

Jul. 31, 2015   (KR) .................... 10-2015-0108583

(51) Int. Cl.
*F16K 51/02*   (2006.01)
*F16K 3/02*   (2006.01)
(Continued)

(52) U.S. Cl.
CPC ............... *F16K 51/02* (2013.01); *F16K 3/02* (2013.01); *F16K 3/0245* (2013.01); *F16K 3/18* (2013.01);
(Continued)

(58) Field of Classification Search
CPC .......... F16K 51/02; F16K 3/0245; F16K 3/18; F16K 3/02; F16K 3/314; H01L 21/02; H01L 21/02367
(Continued)

(56) References Cited

U.S. PATENT DOCUMENTS 5,626,324 A * 5/1997 Nakamura ............... F16K 3/18
251/158
6,390,449 B1 * 5/2002 Ishigaki ............... F16K 3/184
251/193

(Continued)

FOREIGN PATENT DOCUMENTS

JP    2000337531 A    12/2000
KR    101071955 B1    10/2011
(Continued)

*Primary Examiner* — John Bastianelli
(74) *Attorney, Agent, or Firm* — Patentfile, LLC; Bradley C. Fach; Steven R. Kick

(57) ABSTRACT

A bidirectional gate valve including: a blade (200) installed in a valve housing (100) having first and second passage holes (110, 120) to open/close the first and second passage holes (110, 120); a shaft (300) coupled to a lower portion of the blade (200); a first driving block (400) including: a first cylinder (410) which is provided under the valve housing (100) and into which the shaft (300) is inserted; a first piston (420) installed inside the first cylinder (410) and coupled to a lower portion of the shaft(300) to vertically move the shaft (300) according to pressure change inside the first cylinder (410).

5 Claims, 9 Drawing Sheets

(51) Int. Cl.
    *F16K 3/18*     (2006.01)
    *F16K 3/314*    (2006.01)
    *H01L 21/02*    (2006.01)

(52) U.S. Cl.
    CPC .............. *F16K 3/314* (2013.01); *H01L 21/02* (2013.01); *H01L 21/02367* (2013.01)

(58) Field of Classification Search
    USPC ........................................ 251/195–203, 284
    See application file for complete search history.

(56) References Cited

U.S. PATENT DOCUMENTS

| | | | | |
|---|---|---|---|---|
| 6,966,538 B2* | 11/2005 | Hayashi | .................... | F16K 3/16 251/187 |
| 7,066,443 B2* | 6/2006 | Ishigaki | .................. | F16K 51/02 251/195 |
| 7,735,804 B2* | 6/2010 | Chu | ........................ | F16K 51/02 251/203 |

FOREIGN PATENT DOCUMENTS

| | | |
|---|---|---|
| KR | 101258240 B1 | 4/2013 |
| KR | 1020130098476 | 9/2013 |
| KR | 101376045 B1 | 3/2014 |

\* cited by examiner

US 10,352,480 B2

BIDIRECTIONAL GATE VALVE

This Application is a 35 U.S.C. 371 National Stage Entry of International Application No. PCT/KR2016/007484 filed on Jul. 11, 2016, which claims the benefit of Republic of Korea Patent Application No. 10-2015-0108583, filed on Jul. 31, 2015, the entire disclosures of which are incorporated by reference herein.

TECHNICAL FIELD

The present invention relates to a bidirectional gate valve, and particularly, to a bidirectional gate valve 1 which is characterized by including: a blade 200 installed inside a valve housing 100 having first and second passage holes 110 and 120, which respectively have an open front surface and an open rear surface, and configured to open/close the passage holes 110 and 120; a shaft 300 coupled to a lower portion of the blade 200; a first driving block 400 including: a first cylinder 410 which is provided under the valve housing 100 and into which the shaft 300 is inserted; a first piston 420 installed inside the first cylinder 410 and coupled to a lower portion of the shaft 300 to vertically move the shaft 300 according to pressure change inside the first cylinder 410; and horizontal movement guide rollers 430 and 430' provided on both outer sides thereof to guide a horizontal movement of the blade 200; a second driving block 500 which is coupled to a lower portion of the first guiding block 400 so as to be vertically movable and guides the horizontal movement of the blade according to the vertical movement such that the horizontal movement guide rollers 430 and 430' are respectively inserted into both inner side surfaces the second driving block 500; a third driving block 600 including: first and second mounting parts 610 and 620 provided under the second driving block 500 and including therein respective independent spaces; a second piston 611 provided to the first mounting part 610 and coupled to the second driving block 500 to vertically move the second driving block 500 according to pressure change inside the first mounting part 610; and a movement restricting member 621 which is installed to the second mounting part 620 so as to be vertically movable and restricts a downward movement of the second piston 611; and a main body bracket 700 provided under the valve housing 100 to accommodate the first, second, and third driving blocks 400, 500, and. 600.

BACKGROUND ART

In general, high-precision products such as semiconductor elements or substrates require high precision, and thus, high cleanliness and special production technology have been demanded.

For this reason, the high-precision products are favorably manufactured in a vacuum state in which foreign substances contained in air are completely prevented from contacting the devices.

Thus, a technique of sealing the vacuum work zone of a semiconductor manufacturing apparatus from the atmosphere has crucial influence on the quality of high-precision products.

Accordingly, in a manufacturing process of high-precision products, a gate valve is used to selectively construct instantaneous vacuum environment.

Such a gate valve is roughly classified into two types—a single-direction type and a bidirectional type—and a type suitable for the characteristics of the manufacturing process is selected and installed.

In particular, in the case of the bidirectional type gate valve, a movement space of a high-precision product may be selectively closed, and when only the movement space on one side has been set to be closed and a problem occurs in closing the movement space on the one side, the movement space on the other side may be set to be closed, and thus, it is possible to ensure a continuous operation.

Among such a bidirectional gate valve, a "bidirectional gate valve (Korean Patent Registration No. 10-1258240)" of patent document 1 below, includes: a sealing member 110 which is operated in the up-down and front-rear directions inside a vacuum housing 10 provided with openings 11 and 12 respectively having an open front surface an open rear surface and thereby seals the openings 11 and 12; a man shaft 120 which is provided in a first valve housing 20 perpendicularly connected to a lower portion of the vacuum housing 10 and has an upper portion coupled to a lower portion of the sealing member 110;

a valve driving part 130 which is provided to the first valve housing 20, and is provided with: a main cylinder 131 coupled to a lower portion of the main shaft 120; and a main piston 132 installed inside the main cylinder 131, raised or lowered according to the increase/decrease in compressed air supplied into the main cylinder 131, and connected to the main shaft 120; a first moving unit 140 which is provided to an upper portion of a second valve housing 30 vertically connected to a lower portion of the first valve housing 20, coupled to a lower portion of a valve driving part 130 via a first link 40, and thereby rotates the valve driving part 130; a second moving unit 150 which is provided to an upper portion of the second valve housing 30, coupled to the lower side of the valve driving part 130 via a second link 50, and thereby rotates the valve driving part 130; a first rotation driving part 160 which is provided to a lower part of the second valve housing 30, and is provided with: a first piston shaft 161 coupled to a lower portion of the first moving unit 140 and vertically moved; and a first piston 162 into which a first piston shaft 161 is inserted and which is vertically moved; a second rotation driving part 170 which is provided to the lower portion of the second valve housing 30, and is provided with: a second piston shaft 171 coupled to a lower side portion of the second moving unit 150 and vertically moved; and a second piston 172 into which the second piston shaft 171 is inserted and which is vertically moved; and second valve driving parts 180 and 190 which are provided to the lower portion of the second valve housing 30 and which respectively raise or lower the first piston 162 and the second piston 172 of the first rotation driving part 160 and the second rotation driving part 170 according to an increase/decrease of compressed air. The first moving unit 140 and the second moving unit 150 include first and second guide bearings 142 and 152 which are respectively guided along first and second guide panels 141 and 151, which are respectively installed on front and rear surfaces of the second valve housing 30, and thereby allow a vertical movement for rotating the valve driving part 130 to be easily carried out via the first link 40 and the second link 50. The first rotation driving part 160 and the second rotation driving part 170 includes a rotation prevention bushing 163 (not shown) which prevents first and second piston shafts 161 and 171 which are provided to the lower portion of the second valve housing 30 in addition to the first and second piston shafts 161 and 171 and the first and second pistons 162 and 172 from being rotated according to the density of the compressed air when being vertically moved by the first and second valve driving parts 180 and 190. The rotation prevention bushing 163 (not shown) is configured as a bushing guide bearing 163a (not shown) inserted into and guided by a guide groove 161a (not shown), which are positioned inside the second valve housing 30 and formed in the lengthwise direction of the first and second piston shafts 161 and 172. Thus, there was a merit of preventing a great amount of stress from being concentrated on the guide bearing and thereby making it possible to prevent the guide bearing to be worn or broken.

However, the "bidirectional gate valve" of said patent document 1 is configured from parallel-type link structures which are respectively provided as the first and second links 40 and 50 in the same plane to horizontally move the sealing member 110. Thus, there was a limitation in that a mechanical defect may occur when the sealing member is horizontally moved, for example, the precision of the sealing is deteriorated because the pressures of the first and second rotation driving parts 160 and 170 and the pressure of the first and second valve driving parts 180 and 190, which function as a cylinder, are smaller than the pressure of a serial-type cylinder.

In addition, since the first and second links 40 and 50 are positioned in the same plane, and the width dimensions of the first and second valve housings 20 and 30 are relatively increased, there was a limitation in that spatial restriction is increased because it is impossible to manufacture the bidirectional gate valve in a compact type.

DISCLOSURE OF THE INVENTION

Technical Problem

The present invention has been devised to solve the above-mentioned limitations, and the purpose of the present invention is to provide a bidirectional gate valve in which first and second mounting parts functioning as a cylinder for proving a driving force to horizontally move a blade are provided in a serial type, so that the sealing precision of the blade is increased by providing a higher pressure than a parallel type link structure, and high sealing properties of the first and second passage holes can be ensured.

In addition, the present invention provides a bidirectional gate valve which has a relatively decreased width dimension due to the serial type structure thereof, so that the bidirectional valve may be manufactured in a compact type and have less spatial restriction.

Technical Solution

In accordance with an embodiment of the present invention, a bidirectional gate valve (1) is characterized by including: a blade (200) installed inside a valve housing (100) having first and second passage holes (110, 120), which respectively have an open front surface and an open rear surface, and configured to open/close the passage holes (110, 120); a shaft (300) coupled to a lower portion of the blade (200); a first driving block (400) including: a first cylinder (410) which is provided under the valve housing (100) and into which the shaft (300) is inserted; a first piston (420) installed inside the first cylinder (410) and coupled to a lower portion of the shaft (300) to vertically move the shaft (300) according to pressure change inside the first cylinder (410); and horizontal movement guide rollers (430, 430') provided on both outer sides thereof to guide a horizontal movement of the blade (200); a second driving block (500) which is coupled to a lower portion of the first guiding block (400) so as to be vertically movable and guides the horizontal movement of the blade according to the vertical movement such that the horizontal movement guide rollers (430, 430') are respectively inserted into both inner side surfaces the second driving block (500); a third driving block (600) including: first and second mounting parts (610, 620) provided under the second driving block (500) and including therein respective independent spaces; a second piston (611) provided to the first mounting part (610) and coupled to the second driving block (500) to vertically move the second driving block (500) according to pressure change inside the first mounting part (610); and a movement restricting member (621) which is installed to the second mounting part (620) so as to be vertically movable and restricts a downward movement of the second piston (611); and a main body bracket (700) provided under the valve housing (100) to accommodate the first, second, and third driving blocks (400, 500, 600).

The horizontal movement guide grooves (510, 510') may have, on a lower portion thereof, second passage hole close guide parts (511, 511') which are recessed toward the front surface of the valve housing (100), and may have, on an upper portion thereof, first passage hole close guide parts (512, 512') which are recessed toward the rear surface of the valve housing (100); a vertical maintaining parts (513, 513') may be provided to maintain a vertical state of the shaft on an interface of the second passage hole close guide parts (511, 511') and the first passage hole close guide parts (512, 512'); when the horizontal movement guide rollers (430, 430') are positioned on the second passage hole close guide parts (511, 511') according to the vertical movement of the second driving block (500) operated by the driving force of the third driving block (600), the blade (200) may close the second passage hole (120), and when the horizontal movement guide rollers (430, 430') is positioned on the first passage hole close guide parts (512, 512'), the blade (200) may close the first passage hole (110).

The second piston (611) may guide the vertical movement of the second driving block (500) within a range from the second passage hole close guide parts (511, 511') to the vertical maintaining parts (513, 513'); and the movement restricting member (621) may guide the vertical movement of the second driving block (500) within the range from the vertical maintaining parts (513, 513') to the first passage hole close guide parts (512, 512') while contacting the second piston (611).

A motion guide unit (440) which is installed to an upper portion of the first cylinder (410), may be provided with first guide rollers (441, 441') on both side surfaces thereof, and a guide block (442) which is connected to an outer side surface of the shaft (300) to guide the vertical movement of the shaft (300), and first insertion grooves (710, 710') may be formed on both side surfaces of the main body bracket (700) such that the first guide rollers (441, 441') are inserted into the both side surfaces, and the first driving block (400) may be pivotally rotated around the first insertion grooves (710, 710') according to the vertical movement of the second driving block (500).

In addition, second guide rollers (520, 520') which guide the second driving block (500) may be provided on both outer side surfaces of the second driving block (500), and second insertion grooves (720, 720') may respectively be provided on both inner side surfaces of the main body bracket (700) such that the second guide rollers (520,520, 520') are inserted thereinto.

Advantageous Effects

As described so far, in accordance with the present invention, first and second mounting parts functioning as a cylinder for proving a driving force to horizontally move a blade are provided in a serial type, so that there is a merit in that the sealing precision of the blade is increased by providing a higher pressure than a parallel type link structure, and high sealing properties of the first and second passage holes can be ensured.

In addition, there is a merit in that the bidirectional gate valve has a width dimension relatively decreased due to the serial-type structure, so that the bidirectional gate valve may be manufactured in a compact type, and may thereby has less spatial limitation.

MODE FOR CARRYING OUT THE INVENTION

Figure 1:
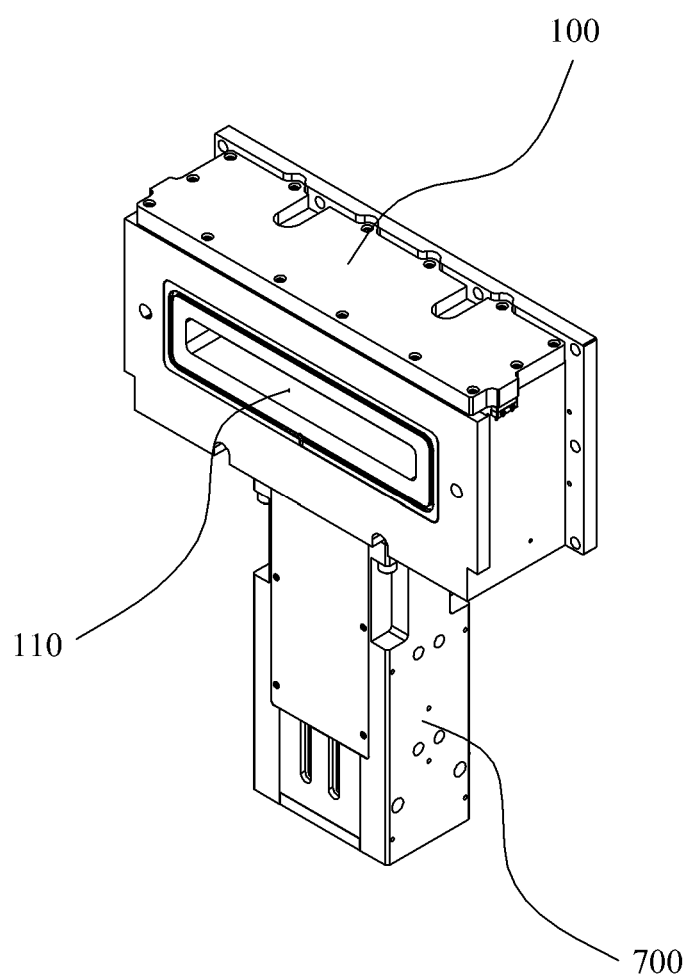
FIG. 1 is a perspective view illustrating an overall appearance of a bidirectional gate valve in accordance with a preferred embodiment of the present invention.

Hereinafter with reference to accompanying drawings, a bidirectional gate valve 1 in accordance with an embodiment of the present invention will be described in detail. First, it should be noted that in the drawings, like components or parts are represented by like reference numerals, if possible. In describing the present invention, when a detailed description about a related well-known function or configuration may obscure the gist of the present invention, the detailed description thereof will not be provided.

A bidirectional gate valve 1 in accordance with an embodiment of the present invention is roughly configured from a blade 200, a shaft 300, a first driving block 400, a second driving block 500, a third driving block 600, and a main body bracket 700.

Figures 7A, 7B:
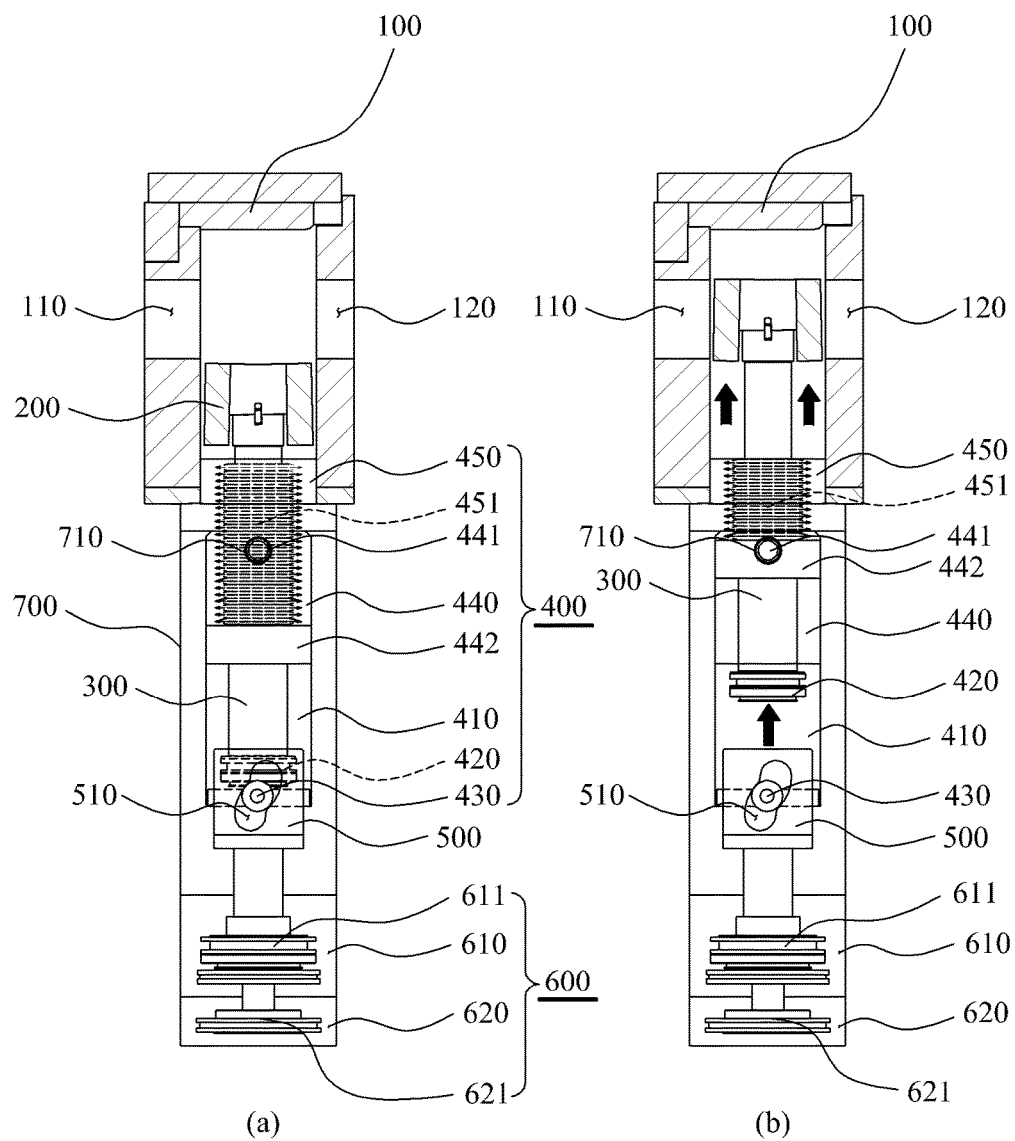
FIG. 7A and FIG. 7B are schematic views illustrating a state in which a blade vertically moves according to the drive of a first driving block from among the components of a bidirectional valve in accordance with a preferred embodiment of the present invention.

Before moving to description, it should be noted that with respect to FIG. 7, the left and right sides are respectively described as the front and rear surfaces, a movement in the up-down direction is described as a vertical movement, and a movement in the front-rear direction is described as a horizontal direction.

Figure 2:
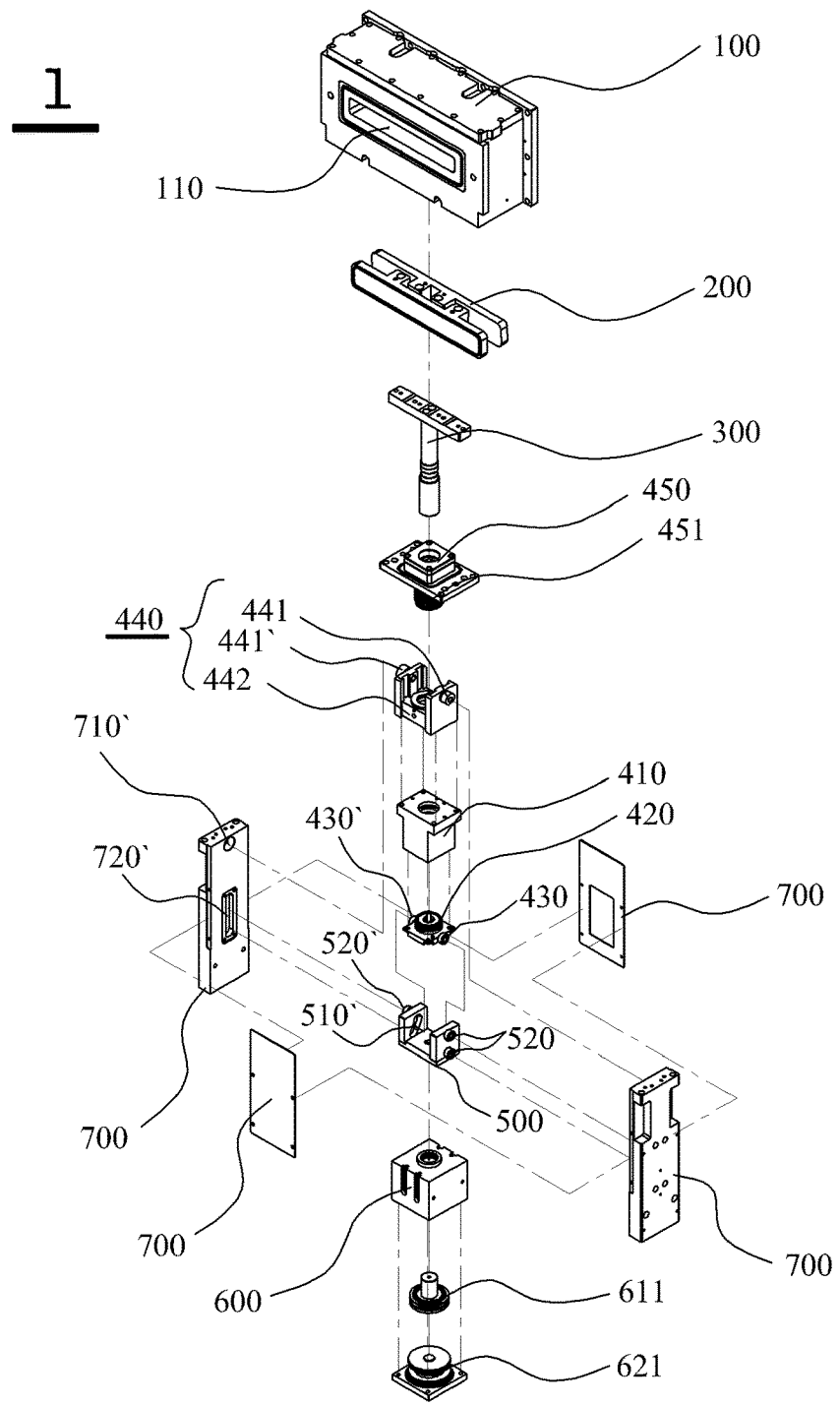
FIG. 2 is an exploded perspective view of a bidirectional gate valve in accordance with a preferred embodiment of the present invention.

First, the blade 200 will be described. As illustrated in FIGS. 1 and 2, the blade 200 is installed inside a valve housing 100, is vertically and horizontally moved by the operations of first, second, and third driving blocks 400, 500, and 600, and thereby functions to open/close the first and second passage holes 110 and 120 which are respectively open toward the front and rear surfaces of the valve housing 100.

Next, the shaft 300 will be described. The shaft 300, as illustrated in FIG. 2, is a component which has an upper portion connected to the blade 200 and a lower portion connected to the first driving block 400, and enables the vertical movement of the blade 200 by transferring the driving force of the first driving block 400 to the blade 200.

Figure 3:
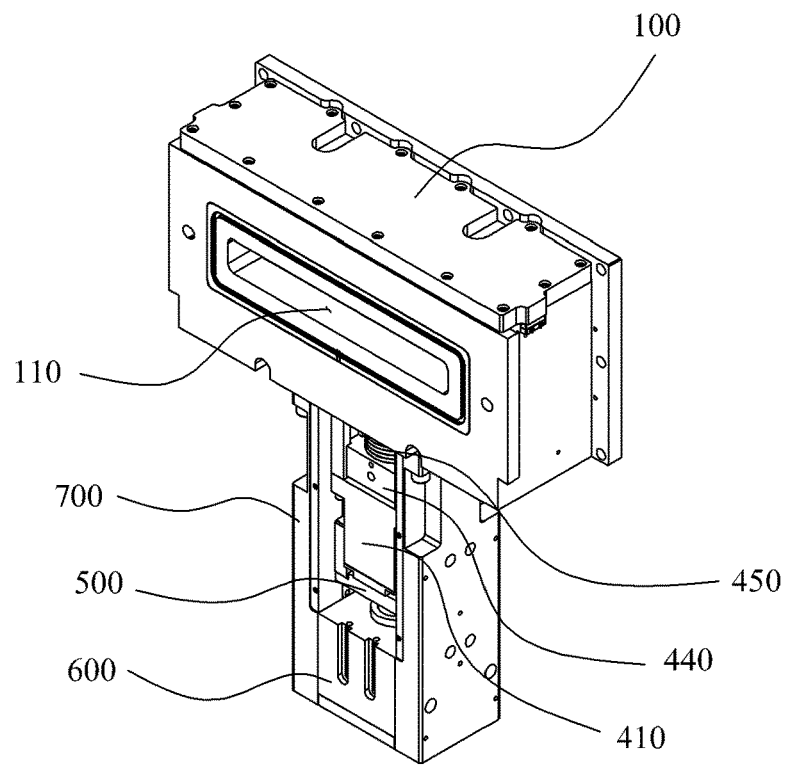
FIG. 3 is a perspective view illustrating first, second, and third driving blocks installed in a main body housing from among the components of a bidirectional valve in accordance with a preferred embodiment of the present invention.
Figures 8A, 8B:
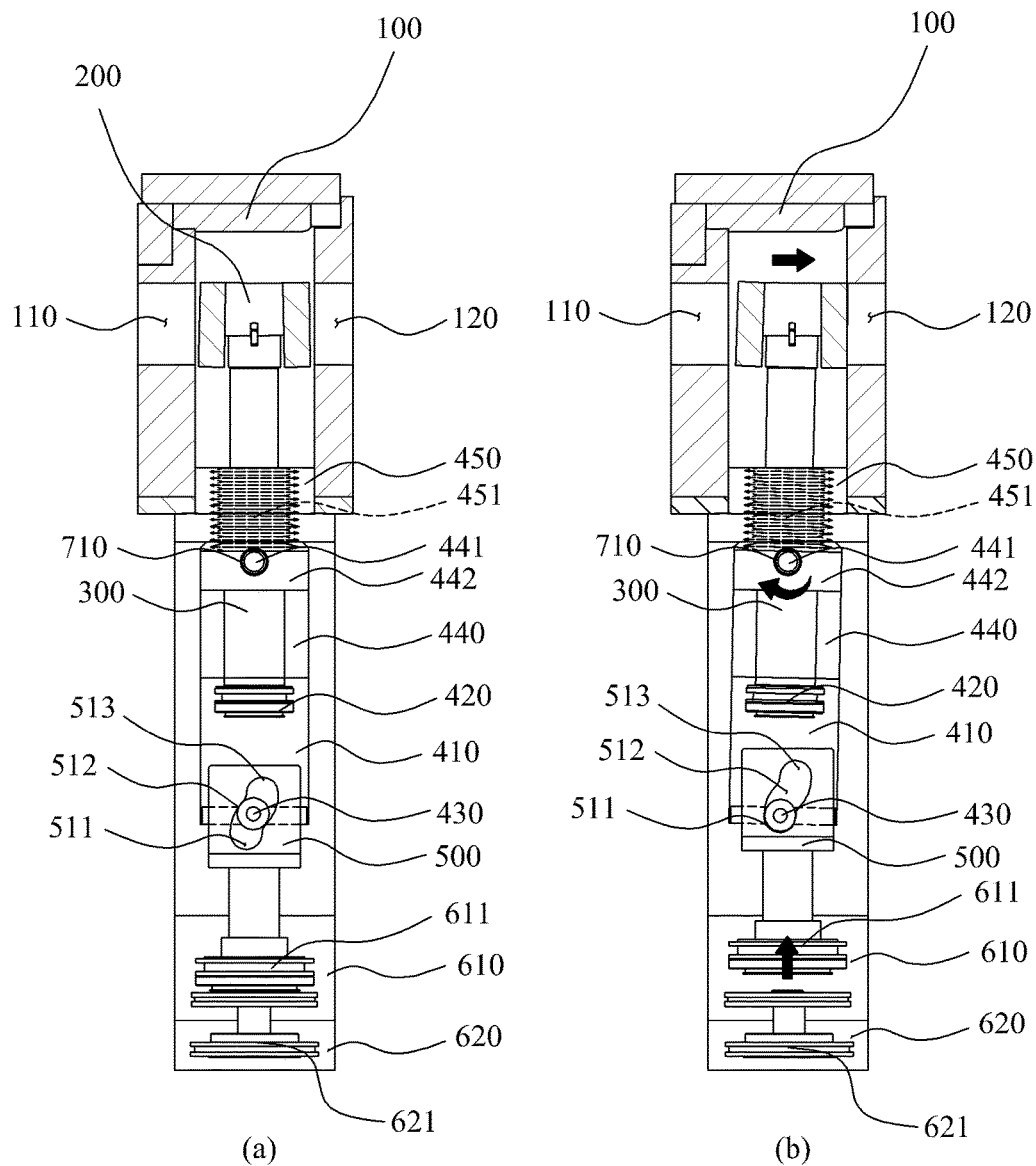
FIG. 8A and FIG. 8B are schematic views illustrating a state in which a blade closes a second passage hole according to the drive of second and third driving blocks from among the components of a bidirectional valve in accordance with a preferred embodiment of the present invention.
Figures 9A, 9B:
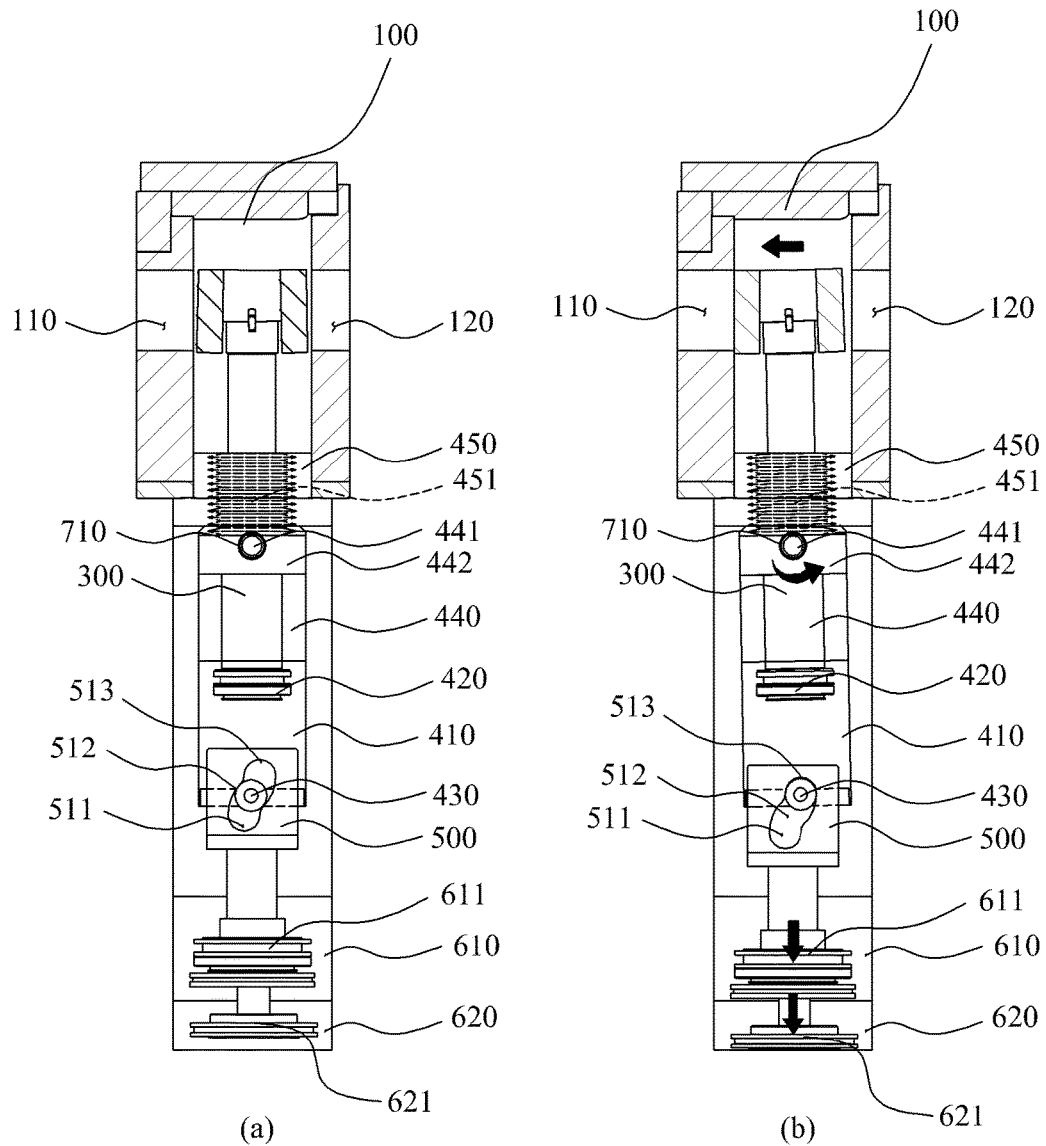
FIG. 9A and FIG. 9B are schematic views illustrating a state in which a blade closes a first passage hole according to the drive of second and third driving blocks from among the components of a bidirectional valve in accordance with a preferred embodiment of the present invention.

Next, the first driving block 400 will be described. The first driving block 400 is a component which is, as illustrated in FIGS. 2 and 3, connected to the shaft 300 and is driven to vertically move the shaft 300 and the blade 200, and which guides, as illustrated in FIGS. 8 and 9, the movement of blade 200 toward the front or rear surface when being horizontally moved by the second and third driving blocks 500 and 600 while the blade 200 is positioned at the top dead center. The first driving block 400 is configured by including a first cylinder 410, a first piston 420, a horizontal movement guide rollers 430 and 430', a motion guide unit 440, and a fixing bracket 450.

The first cylinder 410 has a space formed therein so that the shaft 300 is inserted into the space, and enables the shaft 300 to be raised or lowered according to the pressure change in the space.

The first piston 420 is a component, which is installed inside the first cylinder 410, is coupled to the shaft 300 inserted inside the first cylinder 410, and functions to directly raise or lower the shaft 300 according to the pressure change in the inner space of the first cylinder 410.

The horizontal movement guide rollers 430 and 430' are components provided on both outer side surfaces of the first driving block 400, and are inserted into horizontal movement guide grooves 510 and 510' of the second driving block 500 to be described later. When the second driving block 500 vertically moves, the horizontal movement guide rollers 430 and 430' are moved along the horizontal movement guide grooves 510 and 510' and enables the blade 200 to be moved toward the front or rear surface.

At this point, the horizontal movement guide rollers 430 and 430' can be provided in various types such as rotatable roller types or protruding protrusion types, which are inserted into the horizontal movement guide grooves 510 and 510' and move without restriction.

The motion guide unit 440 is a component, which is fixedly coupled to an upper portion of the first cylinder 410, is connected to the shaft 300 to guide the vertical movement of the shaft 300, and stably moves the first driving block 400 which is horizontally moved by the operation of the second and third driving blocks 500 and 600, and is configured from first guide rollers 441 and 441' and a guide block 442.

The first guide rollers 441 and 441' are components formed on both outer side surfaces of the motion guide unit 440, and are respectively inserted into first insertion grooves 710 and 710' of the main body bracket 700 to be described later. Thus, when the second and third driving blocks 500 and 600 are driven to horizontally move the blade 200 while the shaft 300 and the blade 200 are vertically moved and raised by the first piston 420, the first guide rollers 441 and 441' guide the blade 200, the shaft 300, and the first driving block 400 which pivot around the first insertion grooves 710 and 710', and thereby enables a precise horizontal movement of the blade 200 to the first passage hole 110 or the second passage hole 120.

The guide block 442 is a component provided inside the motion guide unit 440 so as to be vertically movable, and functions to guide a precise vertical movement of the shaft 300 by being coupled to the outer circumferential surface of the shaft 300 when the shaft 300 is vertically moved.

The fixing bracket 450 is a component fixedly coupled between the lower portion of the valve housing 100 and the motion guide unit 440, and functions to fix the first driving block 400.

Figure 5:
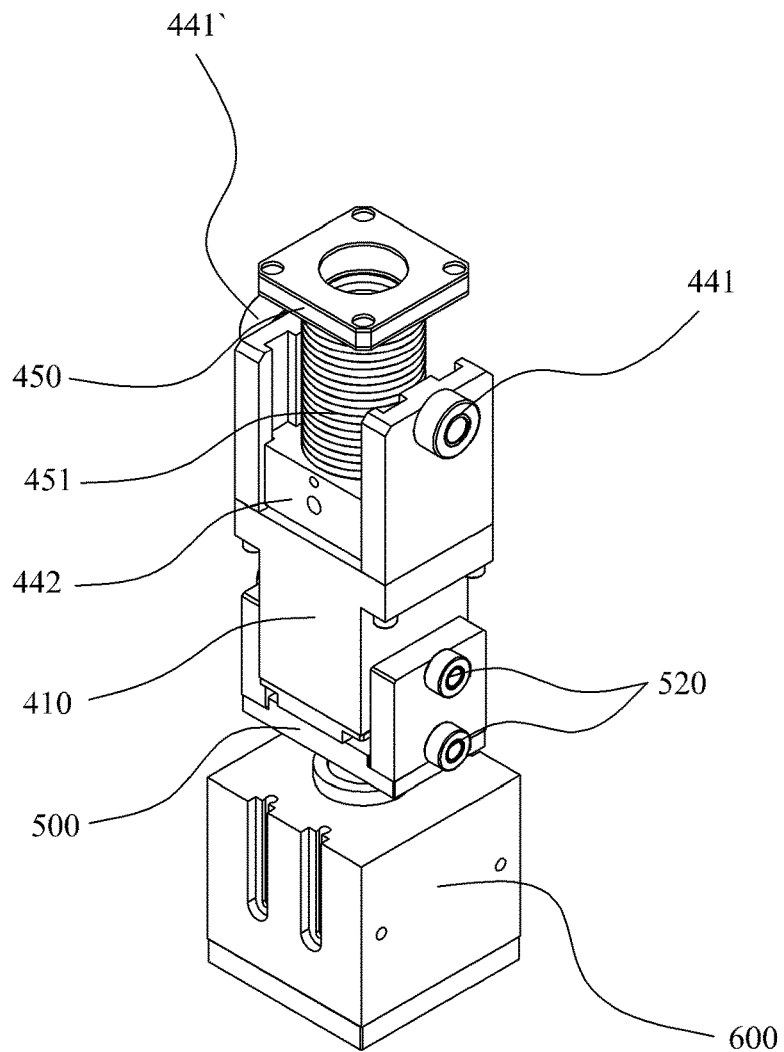
FIG. 5 is a perspective view illustrating coupled state of first, second, and third driving blocks from among the components of a bidirectional valve in accordance with a preferred embodiment of the present invention.

Meanwhile, as illustrated in FIG. 5, a bellows 451 connected to an upper portion of the guide block 442 is favorably provided on a lower portion of the fixing bracket 450, and since the configuration and the function of the bellows 451 corresponds to a well-known technique in the technical field to which the present invention belongs, detailed description thereof will not be provided.

Figure 4:
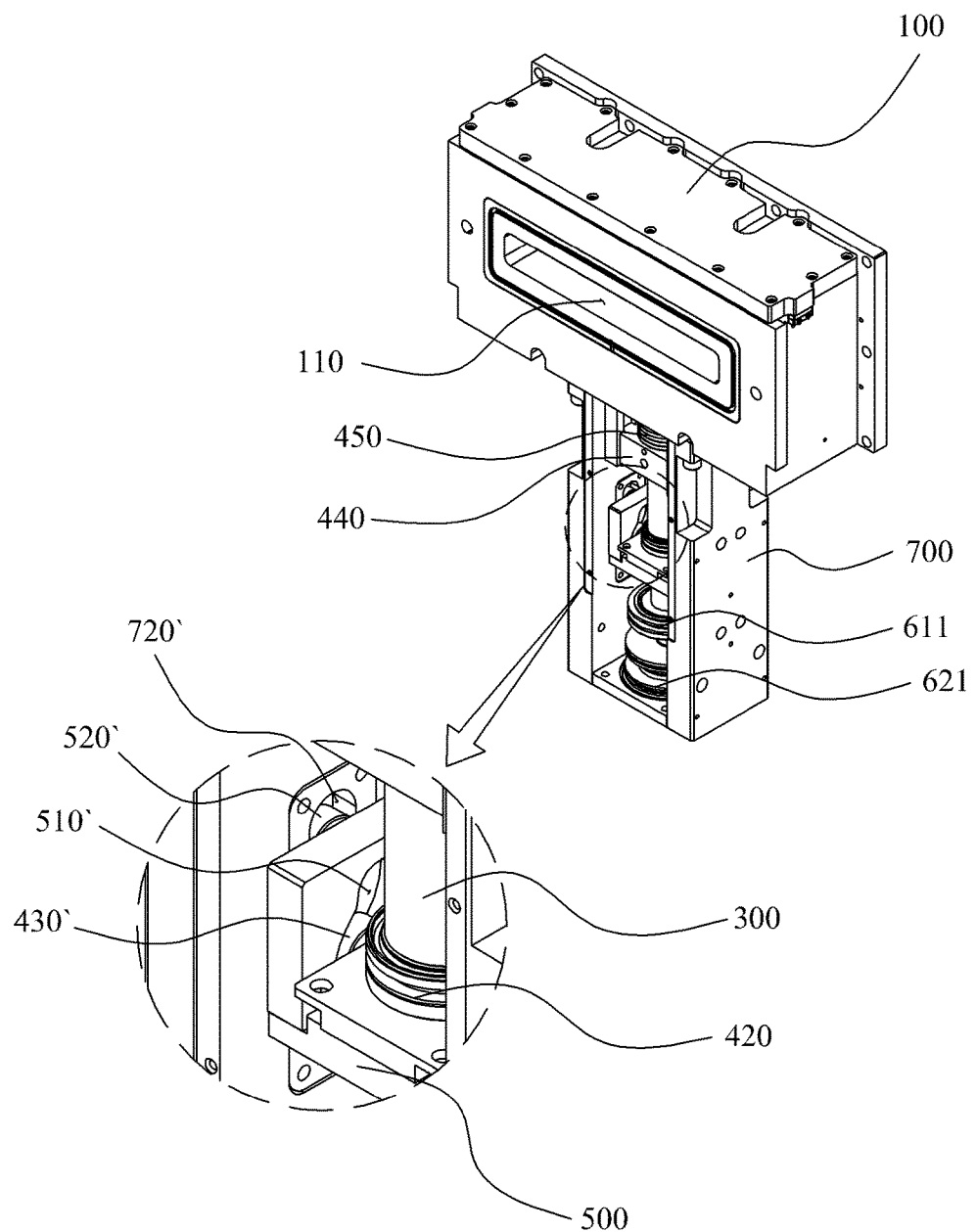
FIG. 4 is a perspective view illustrating coupling relationship of components inside the main body housing from among the components of a bidirectional valve in accordance with a preferred embodiment of the present invention.

Next, the second driving block 500 will be described. The second driving block 500 is, as illustrated in FIG. 2 or FIGS. 4 and 5, a component which is coupled to a lower portion of the first driving block 400 so as to be vertically movable and guides the horizontal movement of the blade 200, and includes horizontal movement guide grooves 510 and 510' and second guide rollers 520 and 520'.

The horizontal movement guide grooves 510 and 510' are components provided to be recessed in both inner side surfaces of the second driving block 500, guide the movement of the horizontal movement guide rollers 430 and 430' inserted into the horizontal movement guide grooves 510 and 510' when the second and third driving blocks 500 and 600 are driven, and function to enable the movement of the blade 200 toward the front surface or the rear surface.

Figure 6:
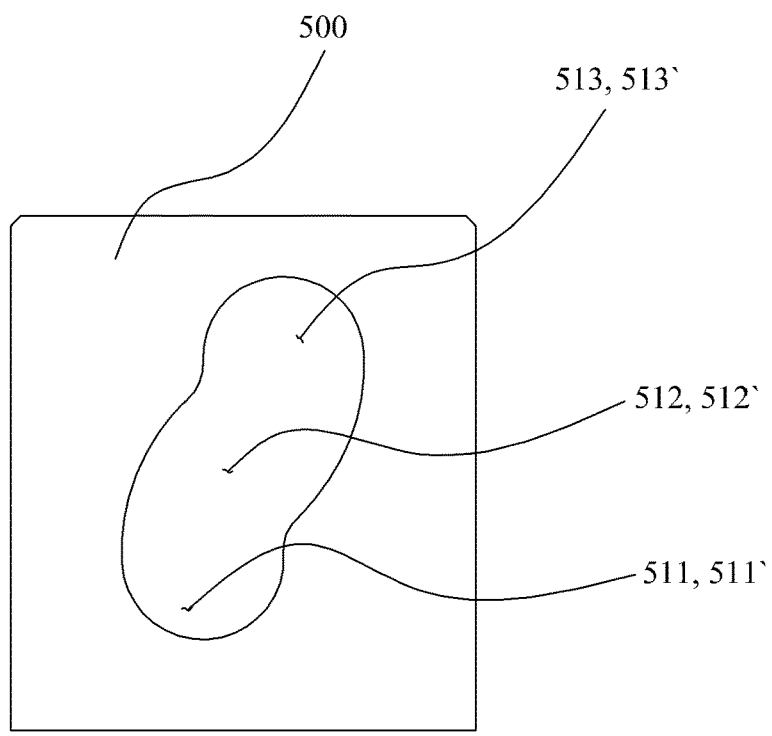
FIG. 6 is a detailed view illustrating horizontal guide grooves from among the components of a bidirectional valve in accordance with a preferred embodiment of the present invention.

To perform such a function, as illustrated in FIG. 6, the horizontal movement guide grooves 510 and 510' have, on a lower portion thereof, second passage hole close guide parts 511 and 511' which are recessed toward the front surface of the valve housing 100, and have, on an upper portion thereof, first passage hole close guide parts 512 and 512' which are recessed toward the rear surface of the valve housing 100. In addition, the present invention is characterized in that a vertical maintaining parts 513 and 513' are provided to maintain a vertical state of the shaft 300 on an interface of the second passage hole close guide parts 511 and 511' and the first passage hole close guide parts 512 and 512'.

Accordingly, when the horizontal movement guide rollers 430 and 430' are positioned on the second passage hole close guide parts 511 and 511' according to the vertical movement of the second driving block 500 operated by the driving force of the third driving block 600, the blade 200 can close the second passage hole 120, and when the horizontal movement guide rollers 430 and 430' is positioned on the first passage hole close guide parts 512 and 512', the blade 200 can close the first passage hole 110.

The second guide rollers 520 and 520' are components provided on both outer side surfaces of the second driving block 500, are inserted into second insertion holes 720 and 720' of the main body bracket 700 to be described later, and functions to guide a precise vertical movement of the second driving block 500.

At this point, the second guide rollers 520 and 520' may favorably be provided in types such as rotatable roller types or protruding protrusion types, and be provided in various types which are inserted into the second insertion grooves 720 and 720' and move without restriction.

Next, the third driving block 600 will be described. The third driving block 600 is, as illustrated in FIGS. 2 and 4, a component which is provided in under the second driving bock 500 and supplies a driving force required to vertically move the second driving block 500, and is configured from a first mounting part 610 and a second mounting part 620.

The first mounting part 610 is a kind of cylinder provided inside the third driving block 600 and has therein a second piston 611.

The second piston 611 is connected to the second driving block 500 and functions to vertically moving the second driving block 500 in the up-down direction according to a pressure change in the first mounting part 610.

The second mounting part 620 is a kind of cylinder provided as an independent space separate from the first mounting part inside the third driving block 600, and has therein a movement restricting member 621.

The movement restricting member 621, in normal state, restricts the range of the vertical downward movement of the second piston 611, and if necessary, functions as a kind of piston which vertically moves downward according to a pressure change in the second mounting part 620 while contacting the second piston 611.

At this point, the second piston 611 enables the vertical movement of the second driving block 500 within a range from the second passage hole close guide parts 511 and 511' to the vertical maintaining parts 513 and 513', and the movement restricting member 621 enables the vertical movement of the second driving block 500 within the range from the vertical maintaining parts 513 and 513' to the first passage hole close guide parts 512 and 512' while contacting the second piston 611.

Meanwhile, the internal pressure of the second mounting part 620 is always set greater than the internal pressure of the first mounting part 610, so that the second piston 611 is prevented from being arbitrarily lowered and the operational reliability of the bidirectional gate valve is ensured.

Meanwhile, the movement restricting member 621 may also be provided as a manual-type screw-bolt coupling structure in addition to the piston moving in the up-down direction by means of air pressure.

Hereinafter with reference to FIGS. 7 to 9, an operational principle of a bidirectional gate valve 1 in accordance with an exemplary embodiment will be described.

Before providing description, as illustrated in FIG. 7, when the states of each component is checked, initially, when the horizontal movement guide rollers 430 and 430' are positioned on the vertical maintaining parts 513 and 513', the air pressure of the first mounting part 610 is low, the second piston 611 is in a lowered state and maintains the state of being in contact with the movement restricting member 621, the air pressure of the second mounting part 620 is high, and the movement restricting member 621 is in a raised state and maintains the state of supporting the second piston 611 ((a) of FIG. 7).

In such a state, first, when the first driving block 400 is raised, the first piston 420 moves upward, and thus, the blade 200 is also raised ((b) of FIG. 7).

Next, as illustrated in (a) of FIG. 8, when the air pressure of the first mounting part 610 is raised while the blade 200 is in a raised state, the second piston 611 moves upward and the second driving block 500 is thereby moves upward.

Since the second driving block 500 moves upward, the horizontal movement guide rollers 430 and 430' positioned on the vertical maintaining parts 513 and 513' of the horizontal movement guide grooves 510 and 510' are moved to the second passage hole close guide parts 511 and 511' along the horizontal movement guide grooves 510 and 510'.

According to the above-mentioned movements, the blade 200, the shaft 300, and the first driving block 400 are rotated clockwise around the second insertion grooves 720 and 720', and thus, the blade 200 is horizontally moved toward the rear surface and closes the second passage hole 120 ((b) of FIG. 8).

Next, as illustrated in (a) of FIG. 9, when the air pressure of the second mounting part 620 is lowered while the blade 200 is in the raised state, the movement restricting member 621 moves downward, the second piston 611 also moves downward simultaneously, and the second driving block 500 is thereby moves downward.

Since the second driving block 500 moves downward, the horizontal movement guide rollers 430 and 430' positioned on the vertical maintaining parts 513 and 513' of the horizontal movement guide grooves 510 and 510' are moved to the first passage hole close guide parts 512 and 512' along the horizontal movement guide grooves 510 and 510'.

According to the above-mentioned movements, the blade 200, the shaft 300, and the first driving block 400 are rotated counterclockwise around the second insertion grooves 720 and 720', and thus, the blade 200 is horizontally moved toward the front surface and closes the first passage hole 110 ((b) of FIG. 9).

Meanwhile, the closure of the first passage hole 110 and the second passage hole 120 may optionally be set in a single direction or dual directions, so when set in a single direction, the closure may be preferably operated only by the operation of the second piston 611, and if necessary (maintenance or cleaning work or the like), the closure may be operated only by the operation of the movement restricting member 621.

So far, optimal examples have been described in the specification with reference to drawings. Specific terms are used herein, but these terms are merely used to describe the present invention and should not be construed as restricting meanings thereof or the scope of the present invention set forth in claims below. Therefore, those skilled in the art could understand that various modifications and equivalent examples can be made therefrom. Hence, the actual technical scope of the present invention should be determined according to the technical concept of the accompanying claims.

The invention claimed is:

1. A bidirectional gate valve (1) comprising:
a blade (200) installed inside a valve housing (100) having first and second passage holes (110, 120), which respectively have an open front surface and an open rear surface, and configured to open/close the passage holes (110, 120);
a shaft (300) coupled to a lower portion of the blade (200);
a first driving block (400) comprising, a first cylinder (410) which is provided under the valve housing (100) and into which the shaft (300) is inserted, a first piston (420) installed inside the first cylinder (410) and coupled to a lower portion of the shaft (300) to vertically move the shaft (300) according to a pressure change inside the first cylinder (410), and horizontal movement guide rollers (430, 430') provided on both outer sides thereof to guide a horizontal movement of the blade (200);
a second driving block (500) which is coupled to a lower portion of the first guiding block (400) so as to be vertically movable and guides a horizontal movement of the blade (200) according to the vertical movement such that the horizontal movement guide rollers (430, 430') are respectively inserted into both inner side surfaces the second driving block (500);
a third driving block (600) provided under the second driving block (500) and comprising therein, first and second mounting parts (610, 620) respectively provided as respective independent spaces, a second piston (611) provided to the first mounting part (610) and coupled to the second driving block (500) to vertically move the second driving block (500) according to pressure change inside the first mounting part (610), and a movement restricting member (621) which is installed to the second mounting part (620) so as to be vertically movable and restricts a downward movement of the second piston (611), wherein an inner pressure of the second mounting part 620 is greater than an inner pressure of the first mounting part (610); and
a main body bracket (700) provided under the valve housing (100) to accommodate the first, second, and third driving blocks (400, 500, 600).

2. The bidirectional gate valve (1) of claim 1, wherein the horizontal movement guide grooves (510, 510') comprise,
on a lower portion thereof, second passage hole close guide parts (511, 511') which are recessed toward the front surface of the valve housing (100), and
on an upper portion thereof, first passage hole close guide parts (512, 512') which are recessed toward the rear surface of the valve housing (100);
vertical maintaining parts (513, 513') are provided to maintain a vertical state of the shaft on an interface of the second passage hole close guide parts (511, 511') and the first passage hole close guide parts (512, 512');
when the horizontal movement guide rollers (430, 430') are positioned on the second passage hole close guide parts (511, 511') according to the vertical movement of the second driving block (500) operated by the driving force of the third driving block (600), the blade (200) closes the second passage hole (120); and
when the horizontal movement guide rollers (430, 430') are positioned on the first passage hole close guide parts (512, 512'), the blade (200) closes the first passage hole (110).

3. The bidirectional gate valve (1) of claim 2, wherein:
the second piston (611) guides the vertical movement of the second driving block (500) within a range from the second passage hole close guide parts (511, 511') to the vertical maintaining parts (513, 513'); and
the movement restricting member (621) guides the vertical movement of the second driving block (500) within the range from the vertical maintaining parts (513, 513') to the first passage hole close guide parts (512, 512') while contacting the second piston (611).

4. The bidirectional gate valve (1) of claim 3, wherein:
a motion guide unit (440) which is installed to an upper portion of the first cylinder (410), is provided with first guide rollers (441, 441') on both side surfaces thereof, and is provided with a guide block (442) which is connected to an outer side surface of the shaft (300) to guide the vertical movement of the shaft (300);

first insertion grooves (710, 710') are formed on both side surfaces of the main body bracket (700) such that the first guide rollers (441, 441') are inserted into the both side surfaces; and the first driving block (400) is pivotally rotated around the first insertion grooves (710, 710') according to the vertical movement of the second driving block (500).

5. The bidirectional gate valve (1) of claim 4, wherein:

second guide rollers (520, 520') which guide the vertical movement of the second driving block (500) are provided on both outer side surfaces of the second driving block (500); and second insertion grooves (720, 720') are respectively provided on both inner side surfaces of the main body bracket (700) such that the second guide rollers (520, 520') are inserted thereinto.

* * * * *